(12) United States Patent
Kim et al.

(10) Patent No.: US 10,332,762 B2
(45) Date of Patent: Jun. 25, 2019

(54) CHEMICAL LIQUID SUPPLY APPARATUS AND SEMICONDUCTOR PROCESSING APPARATUS HAVING THE SAME

(71) Applicant: Samsung Electronics Co., Ltd., Suwon-si, Gyeonggi-do (KR)

(72) Inventors: Young-hoo Kim, Yongin-si (KR); Il-sang Lee, Hwaseong-si (KR); In-gi Kim, Hwaseong-si (KR); Kyoung-hwan Kim, Yongin-si (KR); Hyo-san Lee, Hwaseong-si (KR); Sang-won Bae, Suwon-si (KR); Tae-hong Kim, Seoul (KR); Yong-jun Choi, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 267 days.

(21) Appl. No.: 15/172,740

(22) Filed: Jun. 3, 2016

(65) Prior Publication Data

US 2017/0062242 A1 Mar. 2, 2017

(30) Foreign Application Priority Data

Sep. 1, 2015 (KR) .......................... 10-2015-0123659

(51) Int. Cl.
*H01L 21/67* (2006.01)
(52) U.S. Cl.
CPC .... *H01L 21/6708* (2013.01); *H01L 21/67017* (2013.01)
(58) Field of Classification Search
CPC .................. H01L 21/6708; H01L 21/67017
See application file for complete search history.

(56) References Cited

U.S. PATENT DOCUMENTS

| 6,361,202 B1 | 3/2002 | Lee et al. | |
| 8,251,571 B2 | 8/2012 | Imai | |
| 2004/0235308 A1* | 11/2004 | Sato | H01L 21/02052 438/704 |
| 2007/0169793 A1* | 7/2007 | Shimada | H01L 21/67023 134/26 |

(Continued)

FOREIGN PATENT DOCUMENTS

| KR | 10-2000-0020256 | 4/2000 |
| KR | 10-0938242 | 7/2009 |

(Continued)

*Primary Examiner* — Michael E Barr
*Assistant Examiner* — Benjamin L Osterhout
(74) *Attorney, Agent, or Firm* — Myers Bigel, P.A.

(57) ABSTRACT

A chemical liquid supply apparatus includes a nozzle unit including a nozzle arm and an injection nozzle mounted in an end of the nozzle arm, a chemical liquid supply unit including a first chemical liquid tank accommodating a first chemical liquid and a second chemical liquid tank accommodating a second chemical liquid, and supplying the first chemical liquid and the second chemical liquid to the nozzle unit, and a mixer unit provided in the nozzle unit and discharging a process fluid by mixing the first chemical liquid and the second chemical liquid, wherein the mixer unit includes an in-line mixer mixing the first chemical liquid and the second chemical liquid that are continually injected from the chemical liquid supply unit, and a mixer pipe extending from the in-line mixer to the injection nozzle.

20 Claims, 12 Drawing Sheets

(56) References Cited

U.S. PATENT DOCUMENTS

| | | | | |
|---|---|---|---|---|
| 2007/0289611 | A1* | 12/2007 | Hayashi | H01L 21/02052 134/26 |
| 2008/0173327 | A1* | 7/2008 | Miyagi | B05B 5/03 134/1.3 |
| 2012/0160278 | A1* | 6/2012 | Higashijima | H01L 21/67051 134/33 |
| 2012/0227770 | A1* | 9/2012 | Kaneko | H01L 21/67051 134/36 |
| 2013/0014786 | A1* | 1/2013 | Ito | H01L 21/02041 134/34 |
| 2013/0048609 | A1* | 2/2013 | Ito | H01L 21/67051 216/83 |
| 2014/0060573 | A1* | 3/2014 | Yoshida | H01L 21/02082 134/1.3 |
| 2014/0134345 | A1* | 5/2014 | Inatomi | C23C 18/168 427/422 |
| 2014/0342730 | A1* | 11/2014 | Mulcahy | H04L 67/2847 455/426.1 |
| 2015/0114432 | A1* | 4/2015 | Iwata | B08B 3/02 134/19 |

FOREIGN PATENT DOCUMENTS

| | | |
|---|---|---|
| KR | 1020100046838 | 5/2010 |
| KR | 10-2010-0059408 | 6/2010 |
| KR | 10-2011-0135067 | 12/2011 |
| KR | 10-2012-0008559 | 2/2012 |
| KR | 10-2014-0060968 | 5/2014 |
| KR | 10-2010-0116853 | 12/2015 |

\* cited by examiner

CHEMICAL LIQUID SUPPLY APPARATUS AND SEMICONDUCTOR PROCESSING APPARATUS HAVING THE SAME

CROSS-REFERENCE TO RELATED APPLICATION

This application claims the benefit of Korean Patent Application No. 10-2015-0123659, filed on Sep. 1, 2015, the disclosure of which is incorporated by reference herein in its entirety.

BACKGROUND

The inventive concept relates to a chemical liquid supply apparatus and a semiconductor processing apparatus having the same, and more particularly, to a chemical liquid supply apparatus used in a single wafer type semiconductor manufacturing process, in which high-temperature chemical liquids and functional additives are used, and a semiconductor processing apparatus having the chemical liquid supply apparatus.

Semiconductor processing apparatuses are divided into a batch type processing apparatus for processing a plurality of substrates at the same time and a single wafer type processing apparatus for processing a plurality of substrates one by one. Recently, due to a lack of process capabilities of the batch type processing apparatus, which causes dispersion defects, desiccation defects, etc., the single wafer type processing apparatus has been used instead of the batch type processing apparatus. However, the single wafer type processing apparatus has a lower productivity than the batch type processing apparatus. Therefore, research into improving the productivity of the single wafer type processing apparatus has been actively conducted.

SUMMARY

The inventive concept provides a chemical liquid supply apparatus and a semiconductor processing apparatus including the same, whereby the productivity of a single wafer type semiconductor manufacturing process is improved.

According to an aspect of the inventive concept, there is provided a chemical liquid supply apparatus including a nozzle unit including a nozzle arm and an injection nozzle mounted in an end of the nozzle arm, a chemical liquid supply unit including a first chemical liquid tank configured to accommodate a first chemical liquid and a second chemical liquid tank configured to accommodate a second chemical liquid, and configured to supply the first chemical liquid and the second chemical liquid to the nozzle unit, and a mixer unit provided in the nozzle unit and configured to discharge a process fluid by mixing the first chemical liquid and the second chemical liquid, wherein the mixer unit includes an in-line mixer configured to mix the first chemical liquid and the second chemical liquid continually injected from the chemical liquid supply unit, and a mixer pipe extending from the in-line mixer to the injection nozzle.

According to another aspect of the inventive concept, there is provided a semiconductor processing apparatus including a nozzle unit including a nozzle arm and an injection nozzle mounted in an end of the nozzle arm, a chemical liquid supply unit configured to supply a first chemical liquid and a second chemical liquid to the nozzle unit, a mixer unit provided in the nozzle unit and configured to discharge a process fluid by mixing the first chemical liquid and the second chemical liquid, and a substrate supporting plate having a surface on which a substrate is mounted, the surface facing the injection nozzle, wherein the mixer unit includes an in-line mixer configured to mix the first chemical liquid and the second chemical liquid continually injected from the chemical liquid supply unit, and a mixer pipe extending from the in-line mixer to the injection nozzle, and the first chemical liquid includes any one of phosphoric acid, sulfuric acid, and a combination thereof, the second chemical liquid includes a fluorine-based etchant, and at least one of the first chemical liquid and the second chemical liquid includes a silicon-based additive.

According to another aspect of the inventive concept, there is provided a chemical liquid supply apparatus including a nozzle unit, a chemical liquid supply unit and a mixer unit in the nozzle unit. The nozzle unit includes a nozzle arm and an injection nozzle mounted at an end of the nozzle arm, with the nozzle arm being movable to move the injection nozzle. The chemical liquid supply unit includes a first chemical liquid tank holding a first chemical liquid and in fluid communication with the nozzle unit and a second chemical liquid tank holding a second chemical liquid and in fluid communication with the nozzle unit. The mixer unit is configured to receive the first and second chemical liquids from the first and second chemical liquid tanks, to mix the first and second chemicals to form a process fluid, and to inject the process fluid from the injection nozzle.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
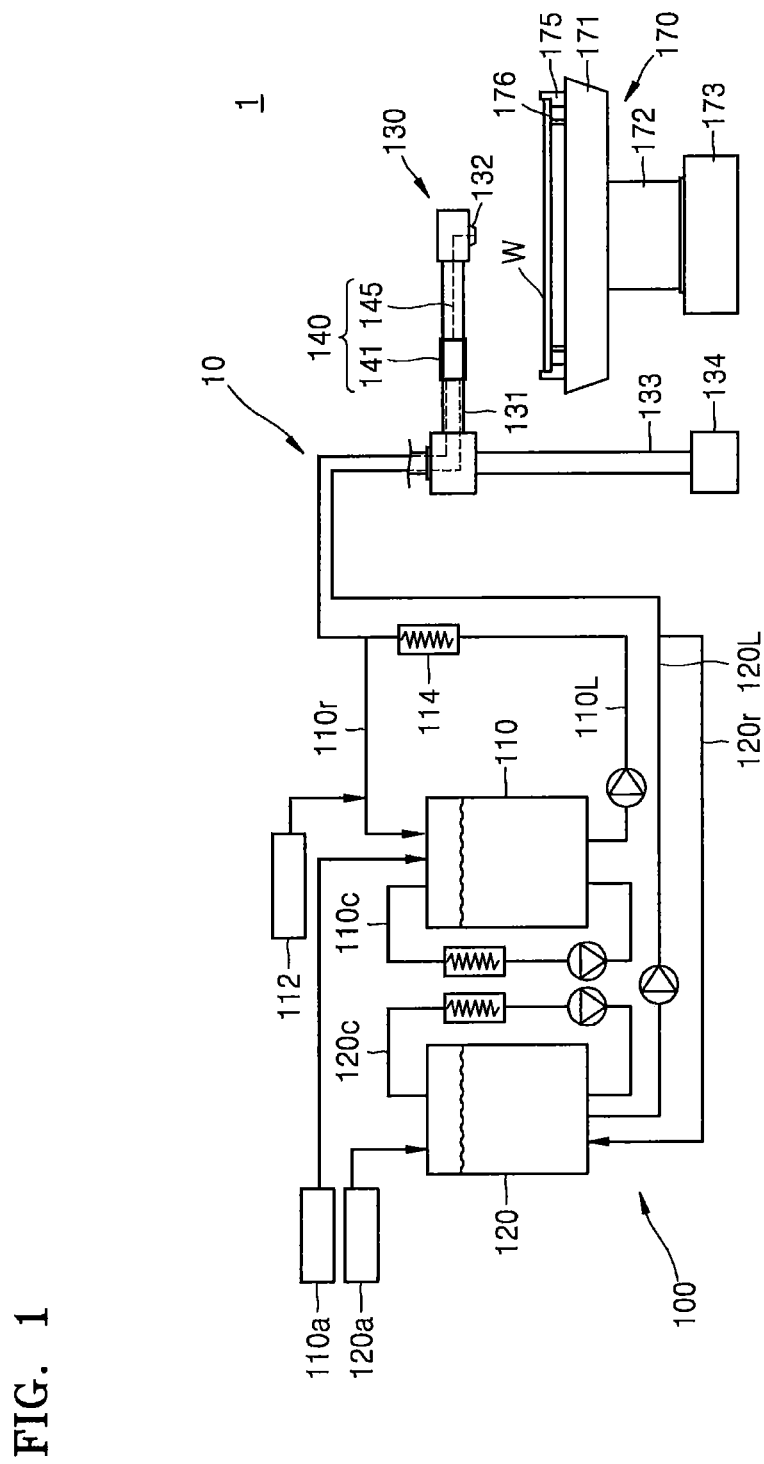
FIG. 1 is a diagram of a semiconductor processing apparatus including a chemical liquid supply apparatus, according to an example embodiment.

The inventive concept now will be described more fully hereinafter with reference to the accompanying drawings, in which elements of the inventive concept are shown. The inventive concept may, however, be embodied in many different forms and should not be construed as limited to the example embodiments set forth herein. Rather, these embodiments are provided so that this disclosure will be thorough and complete, and will fully convey the scope of the inventive concept to one of ordinary skill in the art. In the drawings, the thicknesses of layers and regions and the sizes of components may be exaggerated for clarity.

It will be understood that when an element, such as a layer, an area, or a wafer (substrate), is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the inventive concept are described herein with reference to schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Hereinafter, various elements or features of different embodiments may be combined.

A chemical liquid supply apparatus and a semiconductor processing apparatus according to example embodiments as described below may have various elements. Here, only necessary elements of the plasma processing apparatus may be provided, although the inventive concept is not limited thereto.

FIG. 1 is a diagram of a semiconductor processing apparatus 1 including a chemical liquid supply apparatus 10, according to an example embodiment.

Referring to FIG. 1, the chemical liquid supply apparatus 10 may include a chemical liquid supply unit 100, a nozzle unit 130, and a mixer unit 140. The semiconductor processing apparatus 1 may also include a substrate supporting plate 170 on a surface of which a substrate W is mounted.

The chemical liquid supply unit 100 may supply at least two chemical liquids to the nozzle unit 130. For example, the chemical liquid supply unit 100 may include a first chemical liquid tank 110 for accommodating and supplying a first chemical liquid, and a second chemical liquid tank 120 for accommodating and supplying a second chemical liquid. The first chemical liquid tank 110 is connected to a first chemical liquid supply source 110a, and a first chemical liquid supply line 110L extends from the first chemical liquid tank 110 to the mixer unit 140. The second chemical liquid tank 120 is connected to a second chemical liquid supply source 120a, and a second chemical liquid supply line 120L extends from the second chemical liquid tank 120 to the mixer unit 140.

The first chemical liquid tank 110 may accommodate the first chemical liquid supplied from the first chemical liquid supply source 110a, and the first chemical liquid supply line 110L may supply the first chemical liquid from the first chemical liquid tank 110 to the nozzle unit 130 included in a chamber. The second chemical liquid tank 120 may accommodate the second chemical liquid supplied from the second chemical liquid supply source 120a, and the second chemical liquid supply line 120L may supply the second chemical liquid from the second chemical liquid tank 120 to the nozzle unit 130 included in the chamber.

The first chemical liquid tank 110 may include a chemical liquid that is supplied at a high temperature (for example, a temperature equal to or greater than about 160° C.) and used in an etching process. For example, the first chemical liquid tank 110 may include any one of phosphoric acid ($H_3PO_4$), sulfuric acid ($H_2SO_4$), or a combination thereof. The second chemical liquid tank 120 may include a chemical liquid that is supplied at room temperature. For example, the second chemical liquid tank 120 may include a fluorine-based etchant that is to be added in a chemical liquid included in the first chemical liquid in order to increase an etch rate with respect to a silicon nitride.

A first circulation line 110c connected to the first chemical liquid tank 110 may be provided to circulate the first chemical liquid supplied to the first chemical liquid tank 110 and deionized water (DIW) so as to evenly mix the first chemical liquid and the DIW. A pump and a valve may be provided in the first circulation line 110c. Also, a first circulation heater provided in the first circulation line 110c may heat the first chemical liquid to a predetermined temperature. For example, the first circulation heater may heat the first chemical liquid to a temperature of about 170° C.

A second circulation line 120c connected to the second chemical liquid tank 120 may be provided to circulate the second chemical liquid supplied to the second chemical liquid tank 120 so as to evenly mix the second chemical liquid. A pump and a valve may be provided in the second circulation line 120c. Also, a second circulation heater provided in the second circulation line 120c may heat the second chemical liquid to a predetermined temperature. For example, the second circulation heater may heat the second chemical liquid to a temperature of about 25° C.

A first return or retrieving line 110r may be provided to diverge from the first chemical liquid supply line 110L so as to return or retrieve a portion of the first chemical liquid to the first chemical liquid tank 110. The first retrieving line 110r may be configured such that a flow rate or flux controller is mounted at a point at which the first retrieving line 110r diverges from the first chemical liquid supply line 110L in order to control a flow rate or flux of the first chemical liquid supplied to the nozzle unit 130.

A second return or retrieving line 120r may be provided to diverge from the second chemical liquid supply line 120L so as to return or retrieve a portion of the second chemical liquid to the second chemical liquid tank 120. The second retrieving line 120r may be configured such that a flow rate or flux controller is mounted at a point at which the second retrieving line 120r diverges from the second chemical liquid supply line 120L in order to control a flow rate or flux of the second chemical liquid supplied to the nozzle unit 130.

A DIW supply source 112 may be provided to additionally supply the DIW to the first chemical liquid tank 110 in order to maintain a concentration of the first chemical liquid to be constant. A pump and a valve may be provided in a DIW supply line connected to the DIW supply source 112. The DIW supply source 112 may be connected to the first retrieving line 110r via the DIW supply line, or may be connected (e.g., directly connected) to the first chemical liquid tank 110 via the DIW supply line.

The nozzle unit 130 may include a nozzle support shaft 133, a nozzle driver 134, a nozzle arm 131, and an injection nozzle 132. The nozzle unit 130 may be supplied with at least two chemical liquids from the chemical liquid supply unit 100. Also, the injection nozzle 132 may inject a process fluid onto a process surface of the substrate W, which is laid on a surface of the substrate supporting plate 170.

An end of the nozzle arm 131 may be coupled to the injection nozzle 132, and the other opposite end of the nozzle arm 131 may be coupled to the nozzle support shaft 133. The nozzle support shaft 133 may be vertically mounted at a side of the chamber. An end of the nozzle support shaft 133 is coupled to the nozzle driver 134. The nozzle driver 134 may rotate the nozzle support shaft 133 or cause the nozzle support shaft 133 move upward and downward so that the injection nozzle 132 may move to a process position and a standby position. The process position is where the injection nozzle 132 is spaced apart from a central portion of the substrate W in a direction perpendicular to a surface of the substrate W, and the standby position is where the injection nozzle 132 deviates from the process position. In some embodiments, in the process position, the injection nozzle 132 is centered over the center of the substrate W. The injection nozzle 132 injects a process fluid toward the process surface of the substrate W.

Also, the nozzle arm 131 may be configured to be coupled to the nozzle support shaft 133 and to move the injection nozzle 132 above the substrate W. Alternatively, the nozzle arm 131 may be configured such that the injection nozzle 132 moves above or on the substrate W and injects the process fluid.

The substrate supporting plate 170 may be configured to support the substrate W and rotate the substrate W while a process is performed. The substrate supporting plate 170 may include a body member 171, a support pin 176, a chuck pin 175, and a support shaft 172. The body member 171 may have an upper surface which is approximately circular when viewed from above. The support shaft 172 which is rotatable by a driver member 173 may be fixedly coupled to a lower surface of the body member 171.

A plurality of support pins 176 may be provided. In this case, the support pins 176 may be arranged at an edge portion of the upper surface of the body member 171 to be spaced apart from one other by a predetermined distance and may protrude upwards from the body member 171. The support pins 176 may be arranged in a circular shape. The support pins 176 may support an edge of a rear surface of the substrate W so that the substrate W is spaced apart from the upper surface of the body member 171 by a predetermined distance.

The chuck pin 175 may be provided in a multiple number. The chuck pins 175 may be arranged farther from a center of the body member 171 than the support pin 176. The chuck pin 175 may protrude upwards from the body member 171. The chuck pin 175 may support a side portion of the substrate W so that the substrate W does not deviate from its original position toward a side direction when the substrate supporting plate 170 rotates. The chuck pin 175 may be provided to be capable of a linear movement between a standby position and a support position in a radial direction of the body member 171. The standby position is farther from the center of the body member 171 than the support position. When the substrate W is loaded or unloaded onto the substrate supporting plate 170, the chuck pin 175 may be located in the standby position. When a process is performed with respect to the substrate W, the chuck pin 175 may be located in the support position. The chuck pin 175 may contact a side portion of the substrate W in the support position.

Meanwhile, the mixer unit 140 may discharge a process fluid by mixing the first chemical liquid and the second chemical liquid injected from the chemical liquid supply unit 100. The mixer unit 140 may include an in-line mixer 141 and a mixer pipe 145 extending from the in-line mixer 141 to the injection nozzle 132. The mixer unit 140 may discharge the process fluid by mixing the first chemical liquid and the second chemical liquid injected from the chemical liquid supply unit 100.

The mixer unit 140 may be provided in the nozzle unit 130. An end of the in-line mixer 141 may be supplied with chemical liquids injected from the chemical liquid supply unit 100, and the mixer pipe 145 may transport the process fluid from the other opposite end of the in-line mixer 141 to the injection nozzle 132.

The in-line mixer 141 may be mounted in the nozzle arm 131. The in-line mixer 141 may mix two or more chemical liquids, when the two or more chemical liquids are continually injected from the chemical liquid supply unit 100, and may discharge the process fluid in which the two or more chemical liquids are mixed (e.g., evenly mixed).

An end of the mixer pipe 145 may be connected to the in-line mixer 141 and the other opposite end of the mixer pipe 145 may be connected to the injection nozzle 132. The mixer pipe 145 may transport the mixture of the two or more chemical liquids, discharged from the in-line mixer 141, to the injection nozzle 132. During the transportation, the mixer pipe 145 may provide the time in which the two or more heterogeneous chemical liquids react with each other. A total length of the mixer pipe 145 may be adjusted such that the two or more chemical liquids react with each other and are discharged in a stable state, and may be selected between about 30 cm and about 200 cm. The total length of the mixer pipe 145 may be longer than a distance between the in-line mixer 141 and an end of the nozzle arm 131, and the mixer pipe 145 may have a partially rolled shape.

Meanwhile, an in-line heater 114 may be mounted in the first chemical liquid supply line 110L connecting the first chemical liquid tank 110 to the mixer unit 140. The in-line heater 114 may be provided to adjust a temperature of the chemical liquid which is to be used at a high temperature. The in-line heater 114 may be used to heat the first chemical liquid to a predetermined temperature before the first chemical liquid and the second chemical liquid are mixed. That is, the in-line heater 114 may be provided to heat the first chemical liquid in advance, taking into account a temperature decrease which may occur while the first chemical liquid is mixed with the second chemical liquid in the mixer unit 140, and while the first chemical liquid is transported from the first chemical liquid tank 110 to the mixer unit 140.

For example, when the first chemical liquid includes any one of high temperature phosphoric acid, sulfuric acid, and a combination thereof, and the second chemical liquid includes a fluorine-based etchant supplied in room temperature, the first chemical liquid may be heated by the in-line heater 114 to about 170° C. to about 180° C. to be provided to the mixer unit 140.

In some embodiments, the first chemical liquid supply line 110L may be configured to be shorter in length than the second chemical liquid supply line 120L. Since the first chemical liquid is supplied and used at a high temperature, a temperature change during the transportation of the first chemical liquid from the first chemical liquid tank 110 to the mixer unit 140 may affect a process result. However, since the second chemical liquid may be supplied in room temperature, a temperature change of the second chemical liquid during the transportation may have less effect on a process result.

Thus, in order to help prevent heat loss during the transportation of the high temperature first chemical liquid via the first chemical liquid supply line 110L, the first chemical liquid tank 110 may be arranged to be closer to the mixer unit 140 than the second chemical liquid tank 120. Accordingly, a length of the first chemical liquid supply line 110L may be reduced, and thus, a temperature change which may occur during the transportation of the first chemical liquid may be minimized.

Meanwhile, in some embodiments, the first chemical liquid may include any one of phosphoric acid, sulfuric acid, and a combination thereof, which are used at a high temperature that is equal to or greater than about 160° C. Accordingly, the first chemical liquid tank 110 may discharge the first chemical liquid of a temperature between about 160° C. and about 180° C. to the first chemical liquid supply line 110L.

The first chemical liquid including any one of phosphoric acid, sulfuric acid, and a combination thereof may be used to etch a silicon nitride (SiN). For example, phosphoric acid may react with $Si_3N_4$, which is a silicon nitride, to generate $Si_3(PO)_4$ and $NH_3$, which are water soluble by-products.

However, an etch rate of a silicon nitride is affected by a temperature of the chemical liquid, such as phosphoric acid. Thus, the chemical liquid, such as phosphoric acid, may be required to maintain a high temperature while the chemical liquid is transported from the chemical liquid supply unit 100 to the nozzle unit 130. Also, to improve the process productivity, the chemical liquid, such as a phosphoric acid, may be injected to the substrate W at a high temperature that is at least equal to or greater than about 160° C.

Figure 2:
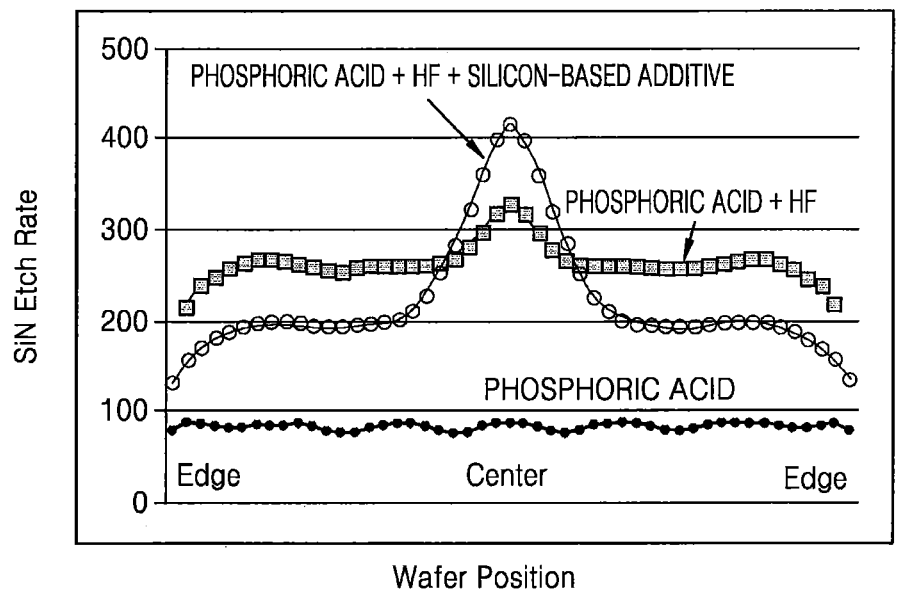
FIG. 2 is a graph illustrating an etch rate of a silicon nitride, according to a comparative example.

FIG. 2 is a graph illustrating an etch rate of a silicon nitride, according to a comparative example.

The comparative example of FIG. 2 includes a case where only high temperature phosphoric acid is used, a case where hydrogen fluoride (HF) is simply mixed in high temperature phosphoric acid, and a case where HF and a silicon (Si)-based additive (for example, Si—O) are simply mixed in high temperature phosphoric acid. Here, to simply mix may denote to mix heterogeneous chemical liquids in a T-shaped pipe.

Referring to FIGS. 1 and 2, in some embodiments, the second chemical liquid may include a fluorine-based etchant, which is a functional additive to improve an etch rate of a silicon nitride.

The etch rate of a silicon nitride may be improved by using high temperature phosphoric acid, but the temperature of phosphoric acid may not be increased to a temperature that is equal to or higher than a predetermined temperature, to prevent damage to a single wafer type etching device. Thus, in order to improve the productivity of the single wafer type etching device using high temperature phosphoric acid, the fluorine-based etchant may be added to high temperature phosphoric acid, as a functional additive. For example, the fluorine-based etchant may include HF, $NH_4F$, ABF, or Si—$F_x$.

As shown in FIG. 2, when HF, which is a fluorine-based etchant, is added in a high temperature phosphoric acid solution, the etch rate of a silicon nitride increases compared to the case where only high temperature phosphoric acid is used. That is, when the fluorine-based etchant is used together with the high-temperature phosphoric acid solution, the processing time of a silicon nitride may be reduced and the productivity of the etching process may be improved.

In order to make a concentration of the process fluid injected via the injection nozzle 132 to be even, the fluorine-based etchant has to be mixed with the chemical liquid, such as phosphoric acid. However, the fluorine-based etchant is excessively volatile if the fluorine-based etchant is mixed with a high temperature chemical liquid. Thus, it is required that the fluorine-based etchant be injected onto the substrate W in a state in which the fluorine-based etchant is not excessively volatile.

In some embodiments, the high temperature first chemical liquid including phosphoric acid, etc., and the room temperature second chemical liquid including a fluorine-based etchant may be supplied to the mixer unit 140 via separate supply lines. Also, the mixer unit 140 may be provided in the nozzle unit 130 so that the mixer unit 140 may mix the first chemical liquid and the second chemical liquid right before the first chemical liquid and the second chemical liquid are injected.

Accordingly, the fluorine-based etchant for improving the etch rate with respect to a silicon nitride may be injected onto a process surface of the substrate W in a state in which the fluorine-based etchant is not excessively volatile, even if the fluorine-based etchant is mixed with a high temperature chemical liquid.

Meanwhile, at least one of the first chemical liquid and the second chemical liquid may include a Si-based additive, which is a functional additive which may passivate a silicon oxide. That is, the Si-based additive may increase a selectivity of a silicon nitride with respect to a silicon oxide. For example, the Si-based additive may include Si—O, Si—$CH_3$, etc.

HF, which is a fluorine-based etchant, may have an etch rate with respect to a silicon oxide, which is dozens of times greater than an etch rate with respect to a silicon nitride. Thus, when a process of etching a silicon nitride layer on a substrate is performed, wherein the substrate is exposed to at least a portion of the silicon nitride layer and at least a portion of a silicon oxide layer, the fluorine-based etchant may excessively etch the silicon oxide.

Thus, the etch rate of a silicon nitride may be improved by using high temperature phosphoric acid or adding a fluorine-based etchant, while an Si-based additive may be used to prevent excessive etching of a silicon oxide.

As shown in FIG. 2, if the high temperature phosphoric acid solution and the fluorine-based etchant are used by being mixed with the Si-based additive, the etch rate of a silicon nitride increases compared to the case where only high temperature phosphoric acid is used.

That is, in the process of etching the silicon nitride layer on the substrate that is exposed to at least a portion of the silicon nitride layer and at least a portion of the silicon oxide layer, the Si-based additive may prevent etching of the silicon oxide layer and may efficiently improve the etch rate of the silicon nitride layer.

Figure 3:
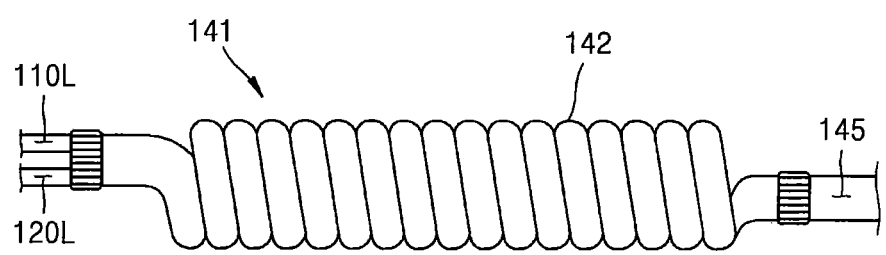
FIGS. 3 and 4 are schematic views of an in-line mixer, according to an example embodiment.
Figure 4:
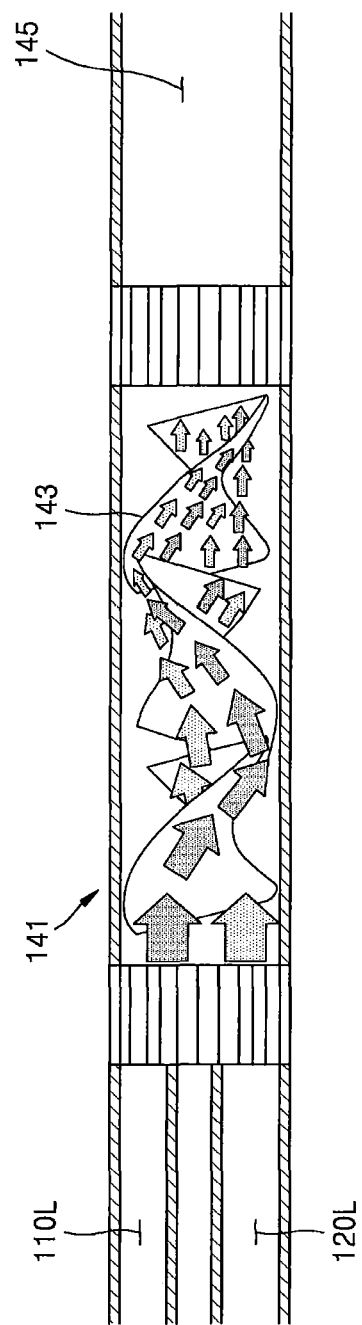
Figure 5:
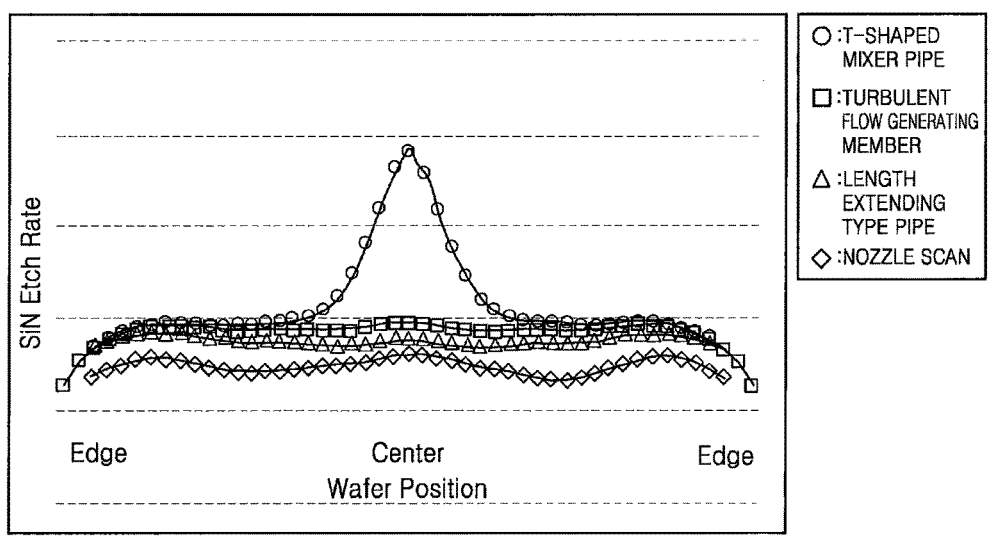
FIG. 5 is a graph illustrating an etching process performed by a chemical liquid supply apparatus according to an example embodiment and of an etch rate of a silicon nitride according to a comparative example.

FIGS. 3 and 4 are views of the in-line mixer 141 according to an example embodiment. FIG. 5 is a graph illustrating an etching process using a chemical liquid supply apparatus according to an example embodiment and of an etch rate of a silicon nitride according to a comparative example.

Referring to FIGS. 3 and 4, the in-line mixer 141 may include a turbulent flow generating member 143 for generating a turbulent flow in a flow in a pipe to increase a reaction speed of at least two chemical liquids. Also, the in-line mixer 141 may include a length extending type pipe 142 for providing a reaction time for two or more heterogeneous chemical liquids and providing a stable chemical composition.

However, as shown in FIG. 2, when the etching process is performed by adding the fluorine-based etchant and the Si-based additive in the high temperature phosphoric acid solution, the etch rate with respect to a silicon nitride increases, but the etch rate may become non-uniform.

Also, when the Si-based additive is mixed with high temperature phosphoric acid and HF, the etch rate may become even more non-uniform, compared to the case where only high temperature phosphoric acid and HF are mixed.

The non-uniformity of the etch rate may occur due to a chemical reaction between the fluorine-based etchant and the Si-based additive in a high temperature condition. When the fluorine-based etchant and the Si-based additive chemically react with each other on a process surface of the substrate W, a concentration of fluorine on the process surface of the substrate W may become non-uniform. The non-uniformity of the concentration of fluorine may cause a silicon nitride to be non-uniformly etched.

Meanwhile, referring to FIG. 3 together with FIG. 1, the in-line mixer 141 included in the mixer unit 140 may include the length extending type pipe 142, according to an example embodiment. The length extending type pipe 142 may be configured to provide a reaction time (e.g., an extended reaction time) for at least two heterogeneous chemical liquids in order to provide a stable chemical composition. That is, the length extending type pipe 142 may provide the necessary time in which the fluorine-based etchant and the Si-based additive sufficiently react with each other. Accordingly, the process fluid, which is in a chemically stable state, may be injected onto the process surface of the substrate W.

The length extending type pipe 142 may be provided with a length which is selected whereby the at least two chemical liquids reacting with each other at a high temperature are provided in a stable chemical composition. The total length of the length extending type pipe 142 may be longer than a linear channel from the in-line mixer 141 to the injection nozzle 132.

For example, the length extending type pipe 142 may have a helical or spiral shape or a curved shape. Here, when the length extending type pipe 142 is spiral-shaped, two or more chemical liquids flowing in the length extending type pipe 142 may make a rotational movement rather than a linear movement, and thus, the two or more chemical liquids may be smoothly mixed with each other.

Likewise, the mixer pipe 145 extending from the in-line mixer 141 to the injection nozzle 132 may also have a helical or spiral shape or a curved shape. Together with the length extending type pipe 142, the mixer pipe 145 may provide the time in which the fluorine-based etchant and the Si-based additive may sufficiently react with each other. A combined length (e.g., flow length) of the length extending type pipe 142 and the mixer pipe 145 may be selected between about 100 cm and about 200 cm.

As shown in FIG. 5, when the in-line mixer 141 having the length extending type pipe 142 is used, an etching uniformity of a silicon nitride increases on the process surface of the substrate W. Further, when the length extending type pipe 142 is used, the non-uniform etching with respect to a silicon nitride, which may occur when the fluorine-based etchant and the Si-based additive are simply mixed by using a T-shaped pipe, may be reduced.

Also, compared to a nozzle scan method which is a method of injecting a process fluid by moving an injection nozzle in a direction horizontal to a surface of the substrate W, when the length extending type pipe 142 is used, the etch rate of a silicon nitride is improved.

Meanwhile, referring to FIG. 4 together with FIG. 1, the in-line mixer 141 included in the mixer unit 140 may include the turbulent flow generating member 143. The turbulent flow generating member 143 may be configured to disturb a linear flow of a fluid flowing in the pipe. The fluid flowing in the pipe may change a flow direction by colliding with the turbulent flow generating member 143, and the flow of the fluid may be converted from a laminar flow into a turbulent flow. In the turbulent flow, two or more heterogeneous chemical liquids may be more evenly mixed with each other during a shorter time than in the laminar flow. That is, the turbulent flow generating member 143 may function as an agitator in the pipe.

In order to interfere with a linear flow of two or more chemical liquids, with respect to a major axis of the pipe in which the fluid flows, the turbulent flow generating member 143 may be or include a screw having an inclined surface. Two or more chemical liquids flowing through the screw may be more evenly mixed with each other, as the two or more chemical liquids become adjacent to an exit of the in-line mixer 141 by flowing downwards along the inclined surface. Further, the screw may be fixed on a central axis provided in the pipe of the in-line mixer 141, and the screw may be configured to rotate with the central axis as an axis. In some embodiments, the turbulent flow generating member 143 may be or include a baffle or plate that has a helical or spiral shape to define a flow passage having a helical or spiral shape. The baffle or plate may define the inclined surface(s) described above.

The turbulent flow generating member 143 may include a Teflon-based material having a heat resistance and a corrosion resistance with respect to a high temperature and a chemical liquid.

Two or more heterogeneous chemical liquids are smoothly mixed, due to the turbulent flow generating member 143, so that a concentration of a chemical element in the process fluid injected by the injection nozzle 132 is not substantially changed over time.

The mixer pipe 145 extending from the in-line mixer 141 including the turbulent flow generating member 143 to the injection nozzle 132 may also have a helical or spiral shape or a curved shape, like the length extending type pipe (142 of FIG. 3). That is, the mixer pipe 145 extending from the turbulent flow generating member 143 may provide the time in which the fluorine-based etchant and the Si-based additive sufficiently react with each other, like the length extending type pipe (142 of FIG. 3). Here, a length (e.g., a flow length) of the mixer pipe 145 may be selected between about 30 cm and about 100 cm.

When the two or more chemical liquids are smoothly mixed by using the turbulent flow generating member 143, a reaction time needed for the chemical liquid mixture to be a stable chemical composition may be reduced. When the reaction time is reduced, the process fluid may be provided in a stable state even if the mixer pipe 145 has a small length. Accordingly, a moving distance of the process fluid until the injection may decrease, and an amount of a temperature decrease of the process fluid may decrease.

As shown in FIG. 5, when the in-line mixer 141 including the turbulent flow generating member 143 is used, the etch rate of a silicon nitride is even on the entire process surface of the substrate W.

Also, when the turbulent flow generating member 143 is used, the etch rate of a silicon nitride increases, compared to the nozzle scan method, and compared to the case where only the length extending type pipe (142 of FIG. 3) is used.

The turbulent flow generating member 143 and the length extending type pipe 142 illustrated in FIGS. 3 and 4 may be provided in the in-line mixer 141 together, or either may be solely used.

Figure 6A:
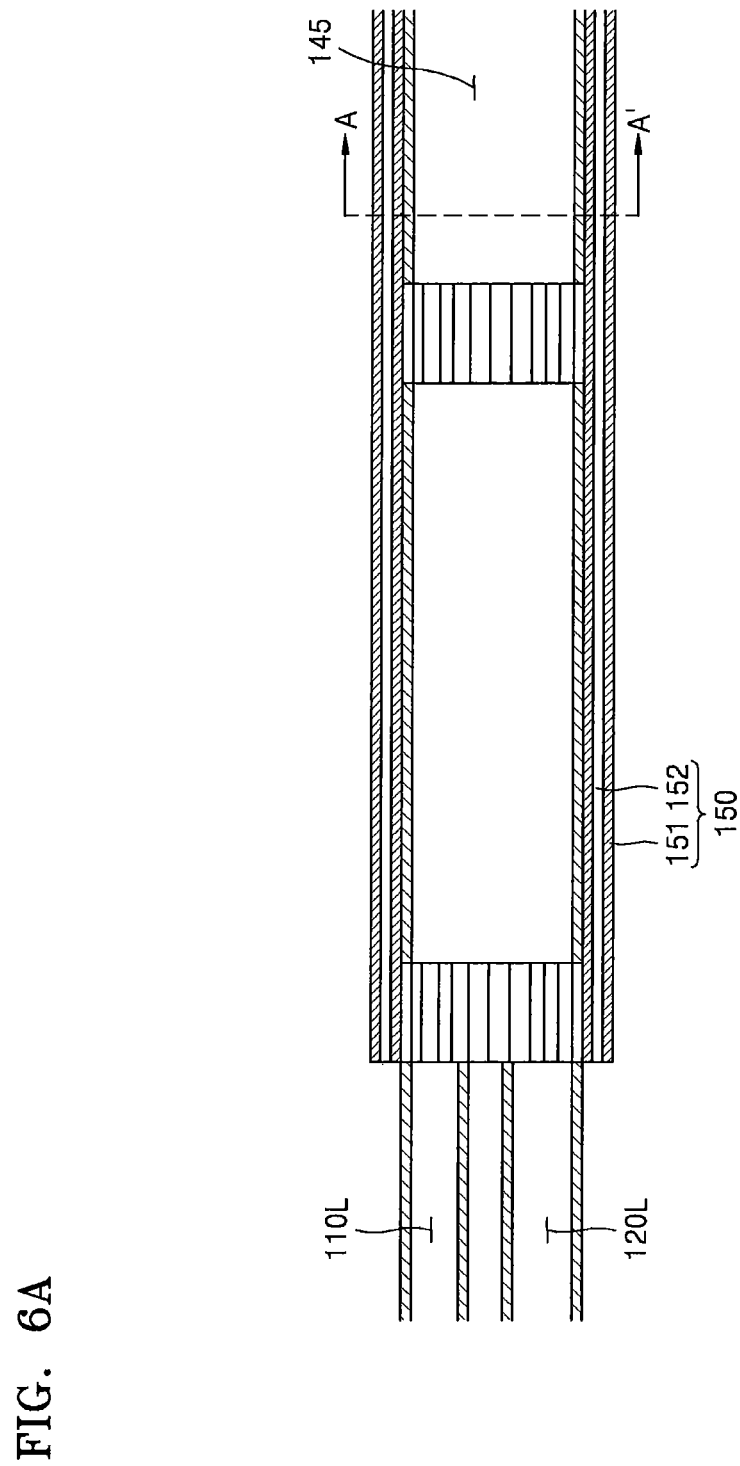
FIG. 6A is a cross-sectional view of a heating member according to an example embodiment.
Figure 6B:
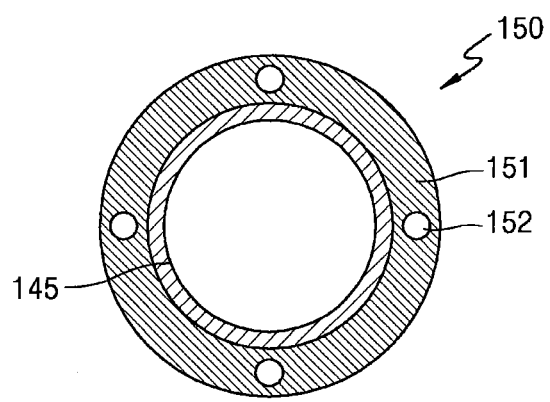
FIG. 6B is a cross-sectional view taken along line A-A' of FIG. 6A.

FIG. 6A is a cross-sectional view of a heating member 150 according to an example embodiment, and FIG. 6B is a cross-sectional view taken along line A-A' of FIG. 6A.

Referring to FIGS. 6A and 6B with FIG. 1, the heating member 150 may be mounted in the mixer unit 140 and may heat the fluid flowing in the mixer unit 140. The heating member 150 may be a heating jacket for a pipe, which includes a covering member 151 having a predetermined thickness and heat or heating wires 152 included in the covering member 151. The covering member 151 may surround an outer circumference of the in-line mixer 141 and an outer circumference of the mixer pipe 145, and may include a glass fiber. The heat wires 152 may be arranged spaced apart from each other by a predetermined distance in a length direction or a width direction of the covering member 151. The heat wires 152 may generate heat for heating the fluid flowing in the mixer unit 140 in response to power supplied from the outside.

The heating member 150 may be mounted in the outer circumferences of the in-line mixer 141 and the mixer pipe 145 to prevent a temperature decrease of the process fluid (for example, a mixture of a first chemical liquid and a second chemical liquid) while the two or more chemical liquids are mixed in the mixer unit 140. The length extending type pipe 142 or the mixer pipe 145 may have an extended length to provide a sufficient time in which the two or more chemical liquids react with each other, and the heating member 150 may heat the process fluid during the time. Thus, a drop of efficiency of the etching process using high temperature phosphoric acid may be reduced or prevented.

The heating member 150 may heat the process fluid so that the process fluid is injected by the injection nozzle 132 in a temperature equal to or greater than a predetermined temperature. For example, the heating member 150 may heat the process fluid so that the process fluid is injected by the injection nozzle 132 in a temperature equal to or higher than about 160° C.

Figure 7:
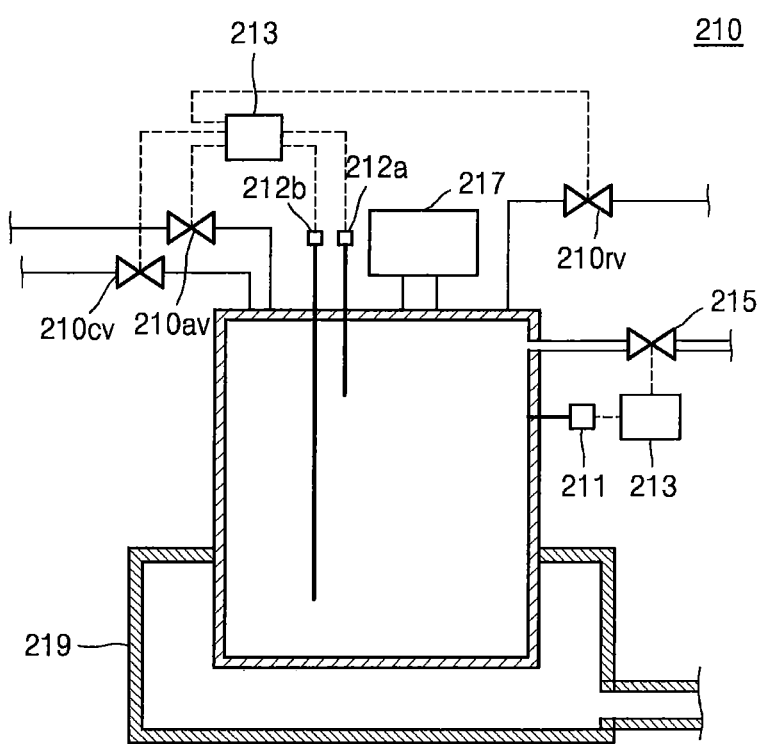
FIG. 7 is a schematic view of a chemical liquid tank according to an example embodiment.

FIG. 7 is a view of a chemical liquid tank 210 according to an example embodiment.

Referring to FIG. 7, the chemical liquid tank 210 may include a pressure sensing unit 211, temperature sensing units 212a and 212b, an interlock unit 213, and a pressure adjusting unit 215.

The chemical liquid tank 210 may be used in a chemical liquid supply apparatus accommodating and supplying a high temperature chemical liquid. The chemical liquid tank 210 may be the first chemical liquid tank 110 illustrated in FIG. 1.

The chemical liquid tank 210 may be supplied with DIW to maintain constant a concentration of a solution, such as high temperature phosphoric acid, etc. Here, when the DIW is excessively supplied, a temperature difference or a viscosity difference of the chemical liquid may occur in the chemical liquid tank 210, and a pressure may rapidly rise due to rapid water evaporation. The rapid rise of pressure may cause a leakage of the chemical liquid to the outside.

Thus, when the chemical liquid that has high viscosity and high temperature and pressure, such as phosphoric acid, etc., is accommodated, as in the first chemical liquid tank 110 of FIG. 1, a device to check the state of the chemical liquid in the chemical liquid tank 210 and control the internal state may be included for a stable operation.

The pressure sensing unit 211 may be mounted in a main body of the chemical liquid tank 210, and may include a pressure gauge or a pressure sensor which may measure the internal pressure of the chemical liquid tank 210. The pressure sensing unit 211 may be configured to generate a sensing signal when the internal pressure of the chemical liquid tank 210 exceeds a predetermined pressure. The sensing signal generated by the pressure sensing unit 211 may be transmitted to the interlock unit 213.

The temperature sensing units 212a and 212b may include the first temperature sensor 212a sensing an upper temperature in an upper portion of the chemical liquid tank 210, and the second temperature sensor 212b sensing a lower temperature in a lower portion of the chemical liquid tank 210. The temperature sensing units 212a and 212b may be configured to generate sensing signals, when a difference between the upper temperature and the lower temperature, measured by the first and second temperature sensors 212a and 212b, respectively, exceeds a predetermined value. For example, the difference between the upper temperature and the lower temperature may denote or indicate that the mixture of the chemical liquid accommodated in the chemical liquid tank 210 has become non-uniform. The sensing signals generated from the temperature sensing units 212a and 212b may be transferred to the interlock unit 213.

The interlock unit 213 may be connected to the pressure sensing unit 211 or the temperature sensing units 212a and 212b, and may accommodate the sensing signal generated and received from the pressure sensing unit 211 and the sensing signal generated from the temperature sensing units 212a and 212b.

For example, the interlock unit 213 may transfer an interlock signal to the pressure adjusting unit 215 according to or in response to the sensing signal generated by the pressure sensing unit 211. The pressure adjusting unit 215 may decrease the pressure in the chemical liquid tank 210 according to or in response to the interlock signal.

The pressure adjusting unit 215 may include a relief valve and a discharge line. When the relief valve is open according to or in response to the interlock signal, the fluid in the chemical liquid tank is discharged via the discharge line, and thus, the pressure in the chemical liquid tank 210 decreases.

Also, the interlock unit 213 may block the supply of the chemical liquid and the DIW supplied to the chemical tank 210 according to or in response to the sensing signal generated by the temperature sensing units 212a and 212b. That is, the interlock unit 213 may control an opening of a valve 210av mounted in a line via which the chemical liquid is supplied from a chemical liquid supply source, a valve 210cv mounted in a chemical liquid circulation line, or a valve 210rv mounted in a chemical liquid retrieve line.

Meanwhile, the chemical liquid tank 210 may include an exhaustion unit 217 mounted on an upper side thereof. The exhaustion unit 217 may prevent a pressure rise in the chemical liquid tank 210 due to evaporation of DIW. In particular, to prevent a rapid rise of pressure in the chemical liquid tank 210 accommodating a high temperature chemical liquid, which occurs due to an excessive supply of the DIW, the exhaustion unit 217 may increase an exhaustion capacity of the chemical liquid tank 210.

Also, the chemical liquid tank 210 may be mounted in an outer tank 219 capable of exhaustion. Accordingly, even if the chemical liquid is leaked, the leaked chemical liquid may be exhausted via the outer tank 219, and thus, additional problems due to the leakage of the chemical liquid may be prevented.

FIGS. 8A through 8D are views for describing a method of manufacturing a semiconductor device by using a semiconductor processing apparatus, according to an example embodiment.

Figure 8A:
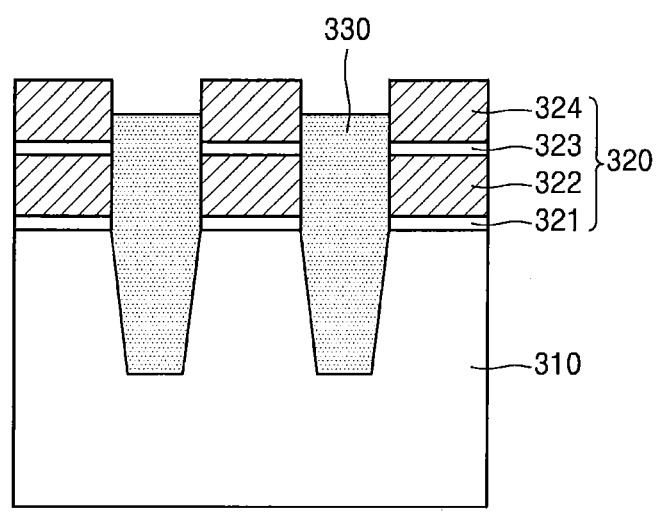
FIGS. 8A through 8D are views for describing a method of manufacturing a semiconductor device by using a semiconductor processing apparatus according to an example embodiment.

Referring to FIG. 8A, a mask stack pattern 320, wherein a pad oxide layer 321, a first silicon nitride layer 322, an intermediate oxide layer 323, and a second silicon nitride layer 324 are sequentially stacked, is formed on the semiconductor substrate 310. The mask stack pattern 320 is used as an etch mask to etch the semiconductor substrate 310 to form a trench in the semiconductor substrate 310. Then, an isolation layer 330 including a silicon oxide layer is formed throughout the semiconductor substrate 310 in which the trench is formed. The isolation layer 330 may be provided to expose the second silicon nitride layer 324.

Figure 8B:
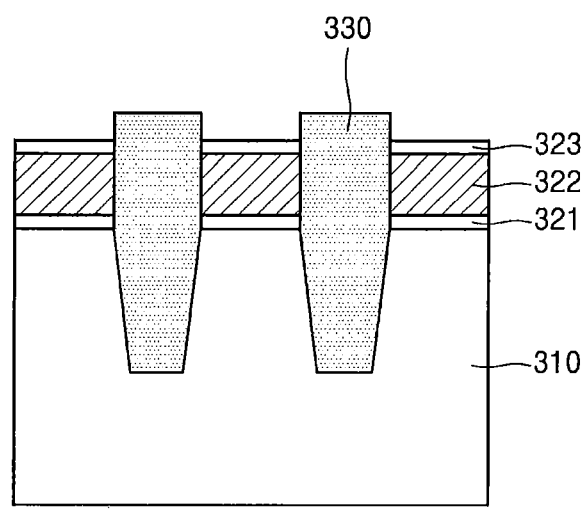

Referring to FIG. 8B, the second silicon nitride layer 324 may be selectively removed by wet etching. The intermediate oxide layer 323 may serve as an etch stop layer to prevent the first silicon nitride layer 322 from being etched. When the second silicon nitride layer 324 is removed, an upper surface of the isolation layer 330 remains and protrudes above an upper surface of the first silicon nitride layer 322.

Here, the second silicon nitride layer 324 may be removed by wet etching performed by using the semiconductor processing apparatus 1 described with reference to FIGS. 1 through 7. The chemical liquid supply apparatus 10 included in the semiconductor processing apparatus 1 may supply a first chemical liquid including high temperature phosphoric acid, a second chemical liquid including a fluorine-based etchant, and a process fluid in which a Si-based additive is included in the first chemical liquid and/or the second chemical liquid.

The injection nozzle 132 of FIG. 1 may inject the process fluid at a point that is spaced apart from a central portion of the semiconductor substrate 310 in a direction perpendicular to a surface of the semiconductor substrate 310. At least a portion of the second silicon nitride layer 324 is exposed and at least a portion of the isolation layer 330 is exposed on a process surface of the semiconductor substrate 310. An etch rate of the second silicon nitride layer 324 may be improved by using a chemical liquid, such as high temperature phosphoric acid, in which the fluorine-based etchant is added, while the isolation layer 330 including a silicon oxide layer may be prevented from being etched by using the Si-based additive.

Figure 8C:
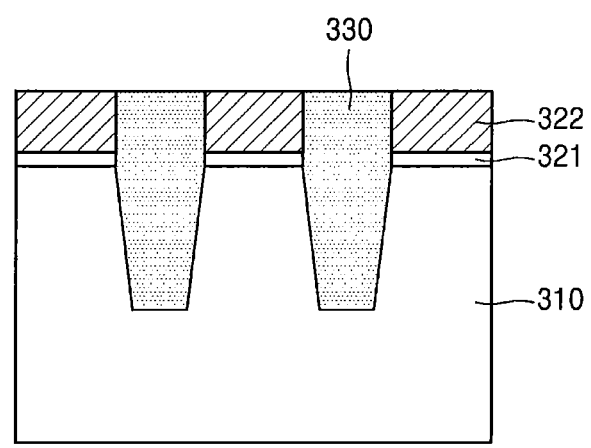

Referring to FIG. 8C, with respect to the isolation layer 330 protruding above the first silicon nitride layer 322, the first silicon nitride layer 322 may be used as an etch stop layer and a chemical mechanical polishing (CMP) process may be performed.

Figure 8D:
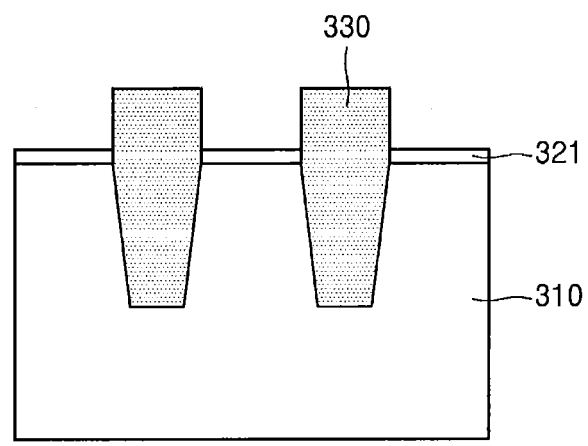

Referring to FIG. 8D, the first silicon nitride layer 322 may be selectively removed by wet etching. Here, the pad oxide layer 321 may be provided as an etch stop layer. Here, the wet etching may be performed by the semiconductor processing apparatus 1 described with reference to FIGS. 1 through 7, in the same or similar way as the process illustrated in FIG. 8B.

While the inventive concept has been particularly shown and described with reference to example embodiments thereof, it will be understood that various changes in form and details may be made herein without departing from the spirit and scope of the following claims.

What is claimed is:

1. A chemical liquid supply apparatus comprising:
   a nozzle unit comprising a nozzle arm and an injection nozzle mounted in an end of the nozzle arm;
   a chemical liquid supply unit comprising a first chemical liquid tank configured to accommodate a first chemical liquid and a second chemical liquid tank configured to accommodate a second chemical liquid, the chemical liquid supply unit configured to supply the first chemical liquid and the second chemical liquid to the nozzle unit;
   a mixer unit provided in the nozzle unit and configured to discharge a process fluid by mixing the first chemical liquid and the second chemical liquid;
   a first chemical liquid supply line connecting the first chemical liquid tank and the mixer unit; and
   a second chemical liquid supply line connecting the second chemical liquid tank and the mixer unit,
   wherein the mixer unit comprises an in-line mixer configured to mix the first chemical liquid and the second chemical liquid that are continually injected from the chemical liquid supply unit, and a mixer pipe extending from the in-line mixer to the injection nozzle,
   wherein the in-line mixer comprises a length extending type pipe having a length configured to increase a time in which the first chemical liquid and the second chemical liquid react with each other,
   wherein the length extending type pipe has a spiral shape, and
   wherein the first chemical liquid supply line and the second chemical liquid supply line are each connected to a first end of the in-line mixer and the mixer pipe is connected to a second, opposite end of the in-line mixer.

2. The chemical liquid supply apparatus of claim 1, wherein the in-line mixer comprises a turbulent flow generating member configured to generate a turbulent flow in a flow of the first chemical liquid and the second chemical liquid.

3. The chemical liquid supply apparatus of claim 1, further comprising a heating member mounted on the mixer unit and configured to heat a fluid flowing in the mixer unit.

4. The chemical liquid supply apparatus of claim 1, further comprising an in-line heater mounted on the first chemical liquid supply line and configured to heat the first chemical liquid.

5. The chemical liquid supply apparatus of claim 1, wherein a temperature of the first chemical liquid accommodated in the first chemical liquid tank is greater than a temperature of the second chemical liquid accommodated in the second chemical liquid tank.

6. The chemical liquid supply apparatus of claim 5, wherein the first chemical liquid comprises any one of phosphoric acid, sulfuric acid, and a combination thereof, and the second chemical liquid comprises a fluorine-based etchant.

7. The chemical liquid supply apparatus of claim 6, wherein at least one of the first chemical liquid and the second chemical liquid comprises a silicon-based additive.

8. The chemical liquid supply apparatus of claim 5, wherein the first chemical liquid tank is connected to a first chemical liquid supply source configured to supply the first chemical liquid to the first chemical liquid tank and connected to a deionized water supply source configured to supply a deionized water to the first chemical liquid tank, and the first chemical liquid tank comprises:
a pressure sensing unit configured to sense a pressure in the first chemical liquid tank;
a temperature sensing unit comprising a first temperature sensor configured to sense a temperature in an upper portion of the first chemical liquid tank and a second temperature sensor configured to sense a temperature in a lower portion of the first chemical liquid tank;
an interlock unit configured to stop the supply of the first chemical liquid and the deionized water to the first liquid chemical tank when a pressure measured by the pressure sensing unit exceeds a predetermined value, or when a difference between the temperature in the upper portion of the first chemical liquid tank and the temperature in the lower portion of the first chemical liquid tank, which are measured by the temperature sensing unit, is greater than a predetermined value; and
a pressure adjusting unit configure to adjust the pressure in the first chemical liquid tank in response to an interlock signal of the interlock unit.

9. The chemical liquid supply apparatus of claim 8, further comprising an exhaust unit provided on an upper side of the first chemical liquid tank.

10. The chemical liquid supply apparatus of claim 1, wherein a length of the mixer pipe is greater than a distance between the in-line mixer and the end of the nozzle arm in which the injection nozzle is mounted, and wherein the mixer pipe has a spiral shape.

11. The chemical liquid supply apparatus of claim 1, wherein the in-line mixer and the mixer pipe each extend horizontally in the nozzle arm.

12. A semiconductor processing apparatus comprising:
a nozzle unit comprising a nozzle arm and an injection nozzle mounted in an end of the nozzle arm;
a chemical liquid supply unit configured to supply a first chemical liquid and a second chemical liquid to the nozzle unit;
a mixer unit provided in the nozzle unit and configured to discharge a process fluid by mixing the first chemical liquid and the second chemical liquid; and
a substrate supporting plate having a surface on which a substrate is mounted, the surface facing the injection nozzle,
wherein the mixer unit comprises an in-line mixer configured to mix the first chemical liquid and the second chemical liquid that are continually injected from the chemical liquid supply unit, and a mixer pipe extending from the in-line mixer to the injection nozzle,
the first chemical liquid comprises any one of phosphoric acid, sulfuric acid, and a combination thereof, the second chemical liquid comprises a fluorine-based etchant, and at least one of the first chemical liquid and the second chemical liquid comprises a silicon-based additive, and
a length of the mixer pipe is greater than a distance between the in-line mixer and the end of the nozzle arm in which the injection nozzle is mounted.

13. The semiconductor processing apparatus of claim 12, wherein a process surface of the substrate facing the injection nozzle has a silicon nitride layer which is at least partially exposed and a silicon oxide layer which is at least partially exposed.

14. The semiconductor processing apparatus of claim 12, wherein, while the process fluid is injected to the substrate by the injection nozzle, the injection nozzle is spaced apart from a central portion of the substrate in a direction perpendicular to the surface of the substrate.

15. The semiconductor processing apparatus of claim 12, wherein a first chemical liquid supply line connecting a first chemical liquid tank configured to accommodate the first chemical liquid with the mixer unit is shorter than a second chemical liquid supply line connecting a second chemical liquid tank configured to accommodate the second chemical liquid with the mixer unit.

16. The semiconductor processing apparatus of claim 12, wherein the mixer pipe has a spiral shape.

17. A chemical liquid supply apparatus comprising:
a nozzle unit comprising a nozzle arm and an injection nozzle mounted at an end of the nozzle arm, the nozzle arm being movable to move the injection nozzle;
a chemical liquid supply unit comprising a first chemical liquid tank holding a first chemical liquid and in fluid communication with the nozzle unit and a second chemical liquid tank holding a second chemical liquid and in fluid communication with the nozzle unit;
a mixer unit in the nozzle unit, the mixer unit configured to receive the first and second chemical liquids from the first and second chemical liquid tanks, to mix the first and second chemical liquids to form a process fluid, and to inject the process fluid from the injection nozzle;
a first chemical liquid supply line connecting the first chemical liquid tank and the mixer unit; and
a second chemical liquid supply line connecting the second chemical liquid tank and the mixer unit,
wherein the mixer unit comprises an in-line mixer and a mixer pipe between the in-line mixer and the injection nozzle, wherein the in-line mixer and the mixer pipe each extend horizontally in the nozzle arm, and wherein the in-line mixer comprises a helical pipe to define a helical flow path to increase a mixing time for the first and second chemical liquids,
wherein the first chemical liquid supply line and the second chemical liquid supply line each extend horizontally into the nozzle arm and connect to a first end of the in-line mixer and a second, opposite end of the in-line mixer connects to the mixer pipe.

18. The chemical liquid supply apparatus of claim 17, wherein the in-line mixer comprises a baffle or plate configured to generate turbulent flow of the first and second chemical liquids.

19. The chemical liquid supply apparatus of claim 17, wherein the mixer unit comprises a heater around an outer circumference of the in-line mixer and/or the mixer pipe.

20. The chemical liquid supply apparatus of claim 17, wherein the first chemical liquid comprises any one of phosphoric acid, sulfuric acid, and a combination thereof, wherein the second chemical liquid comprises a fluorine-based etchant, and wherein at least one of the first chemical liquid and the second chemical liquid comprises a silicon-based additive.

* * * * *